United States Patent [19]
Fischer et al.

[11] Patent Number: 5,789,304
[45] Date of Patent: *Aug. 4, 1998

[54] METHOD OF FORMING A CAPACITOR

[75] Inventors: Mark Fischer; Mark Jost; Kunal Parekh, all of Boise, Id.

[73] Assignee: Micron Technology, Inc., Boise, Id.

[ * ] Notice: The term of this patent shall not extend beyond the expiration date of Pat. No. 5,604,147.

[21] Appl. No.: 741,832

[22] Filed: Oct. 31, 1996

Related U.S. Application Data

[63] Continuation of Ser. No. 440,212, May 12, 1995, Pat. No. 5,604,147.

[51] Int. Cl.$^6$ ............................................. H01L 21/20
[52] U.S. Cl. ............................................. 438/396; 438/253
[58] Field of Search ............................... 438/253, 254, 438/255, 256, 396, 397, 398, 399

[56] References Cited

U.S. PATENT DOCUMENTS

| | | | |
|---|---|---|---|
| 5,158,905 | 10/1992 | Ahn | 438/398 |
| 5,227,322 | 7/1993 | Ko et al. | 438/398 |
| 5,248,891 | 9/1993 | Takato et al. | 257/309 |
| 5,273,925 | 12/1993 | Yamanaka . | |
| 5,330,928 | 7/1994 | Tseng . | |
| 5,340,763 | 8/1994 | Dennison | 438/398 |
| 5,429,980 | 7/1995 | Yang et al. | 438/398 |
| 5,436,187 | 7/1995 | Tanigawa . | |
| 5,438,010 | 8/1995 | Saeki . | |
| 5,498,562 | 3/1996 | Dennison . | |
| 5,512,768 | 4/1996 | Lur et al. | 257/309 |
| 5,604,147 | 2/1997 | Fisher et al. | 438/396 |

FOREIGN PATENT DOCUMENTS

| | | | |
|---|---|---|---|
| 004300357 | 7/1993 | Germany | 257/303 |
| 404079365 | 3/1992 | Japan | 257/303 |
| 5-283643 | 10/1993 | Japan | 257/309 |

*Primary Examiner*—Tuan H. Nguyen
*Attorney, Agent, or Firm*—Wells, St. John, Roberts, Gregory & Matkin, P.S.

[57] ABSTRACT

A semiconductor processing method of forming a stacked container capacitor includes, a) providing a pair of spaced conductive runners relative to a substrate, the conductive runners respectively having electrically insulative sidewall spacers and an electrically insulative cap, the caps having respective outer surfaces; b) providing a node between the runners to which electrical connection to a capacitor is to be made; c) providing an electrically conductive pillar in electrical connection with the node, the pillar projecting outwardly relative to the node between the runners and having a first outer surface positioned outwardly of both runner caps, the pillar completely filling the space between the pair of runners at the location where the pillar is located; d) providing an insulating dielectric layer outwardly of the caps and the conductive pillar; e) etching a container opening through the insulating dielectric layer to outwardly expose the conductive pillar first outer surface; f) etching the exposed conductive pillar to define a pillar second outer surface which is closer to the node than the pillar first outer surface and to deepen the container opening; g) providing an electrically conductive storage node container layer within the container opening over the second outer conductive pillar surface; h) providing a capacitor dielectric layer over the capacitor storage node layer; and i) providing an electrically conductive outer capacitor plate over the capacitor dielectric layer. Such a capacitor construction is also disclosed.

23 Claims, 5 Drawing Sheets

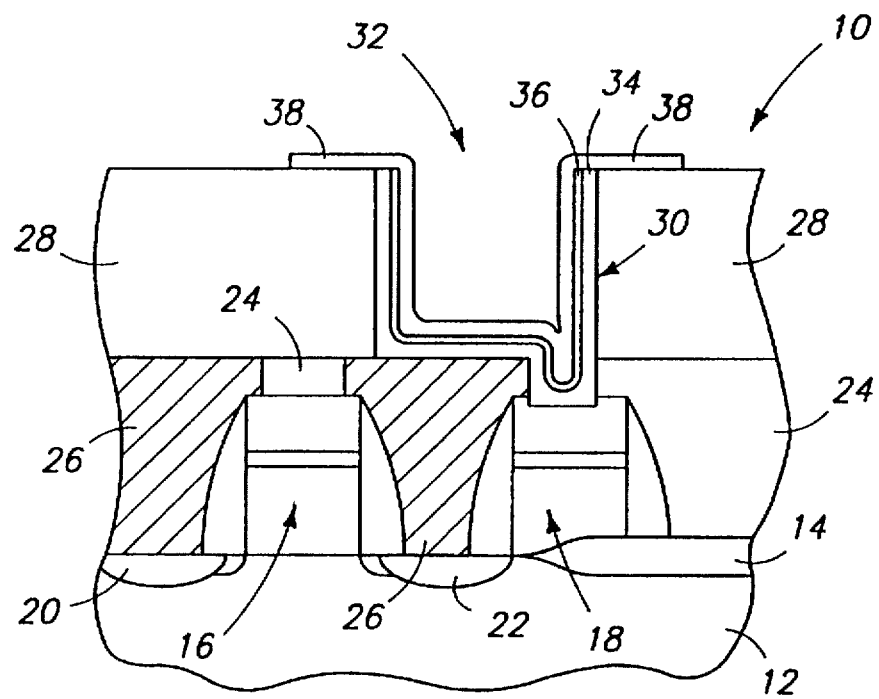
_Fig. 1_
PRIOR ART
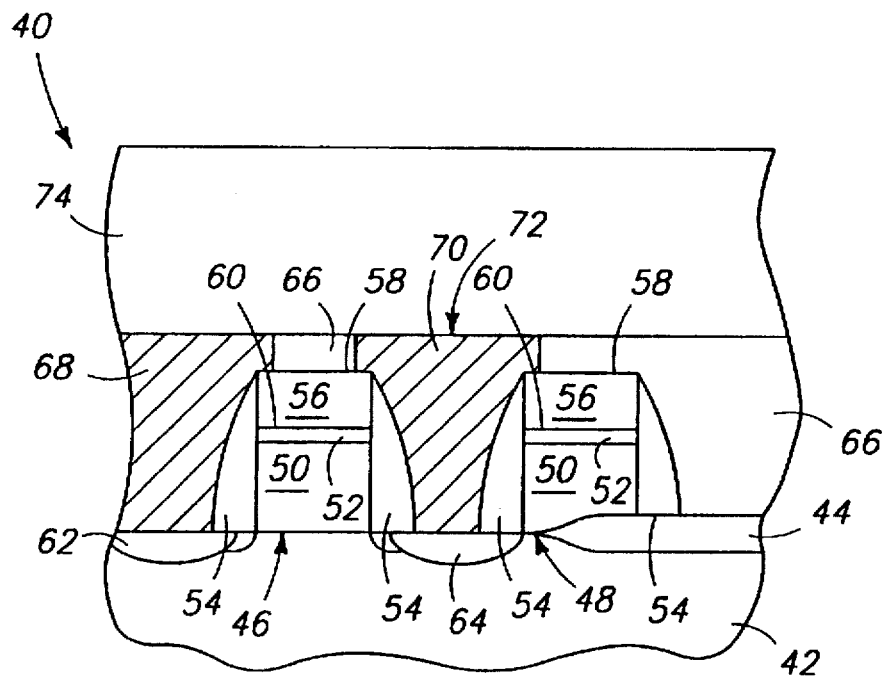
_Fig. 2_

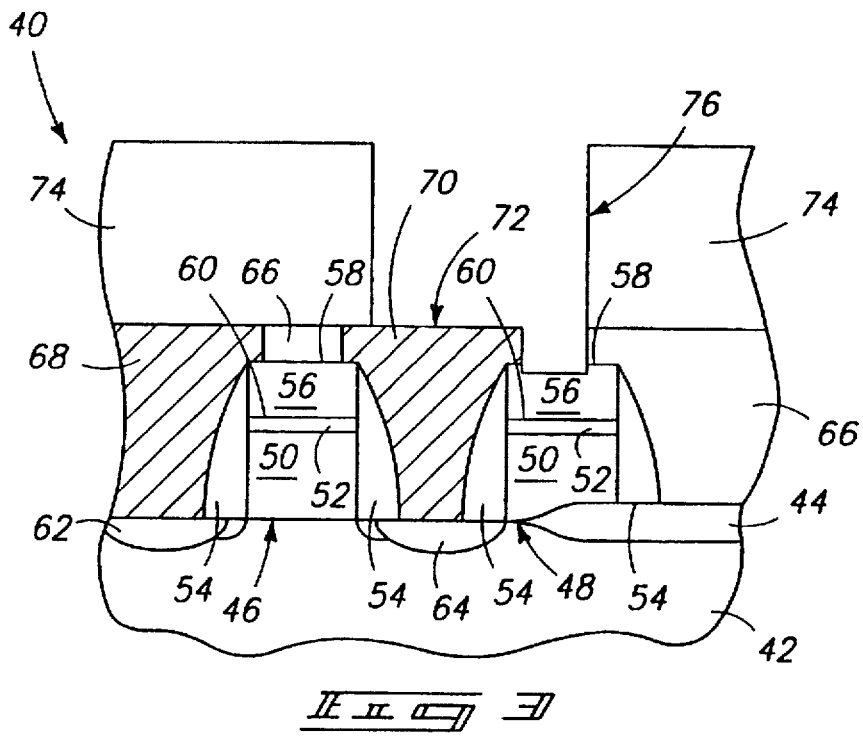
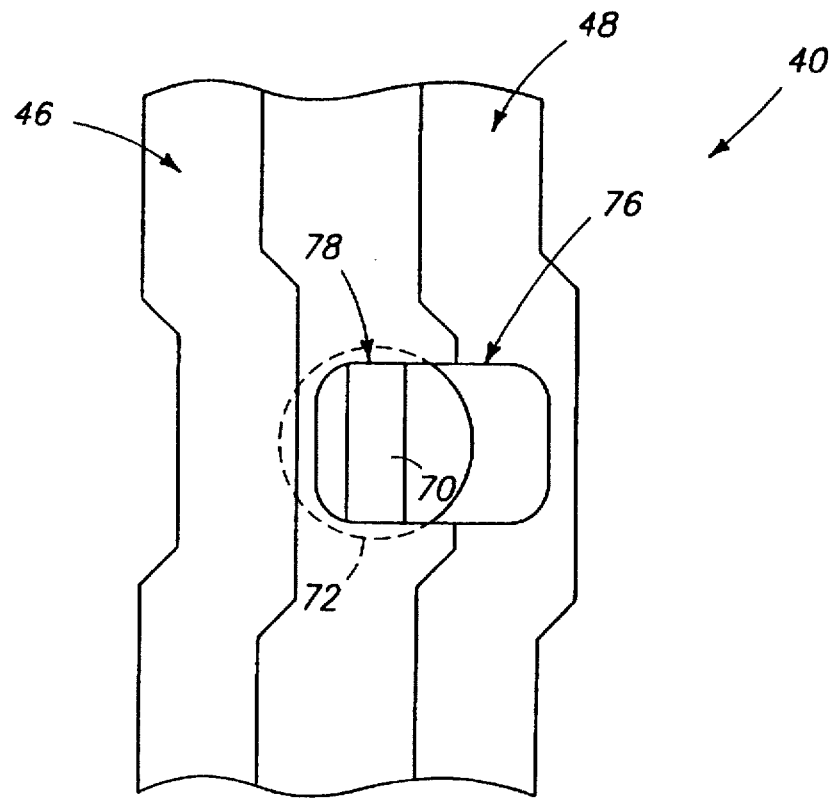

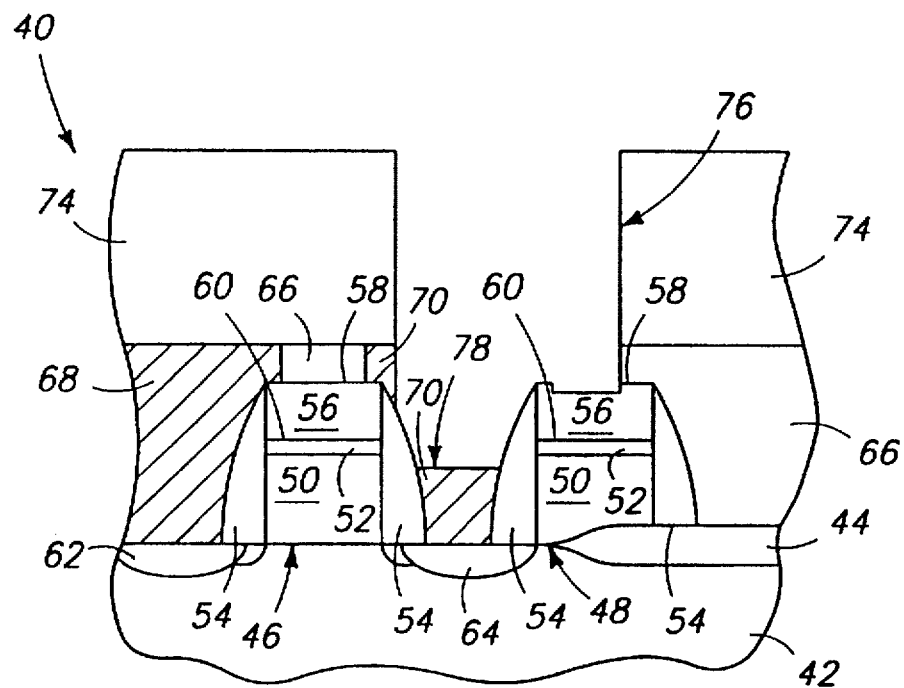
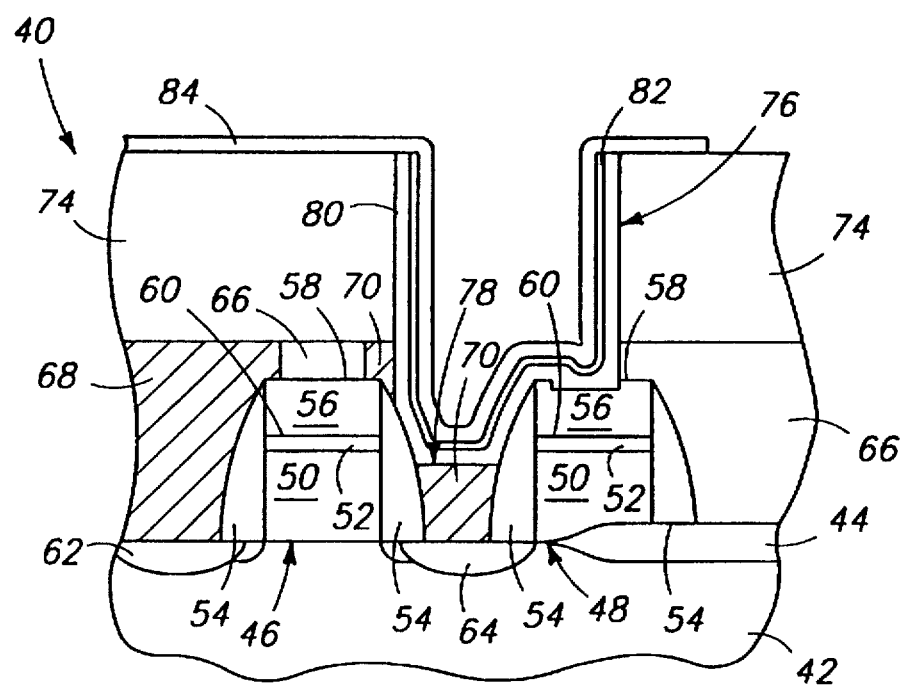

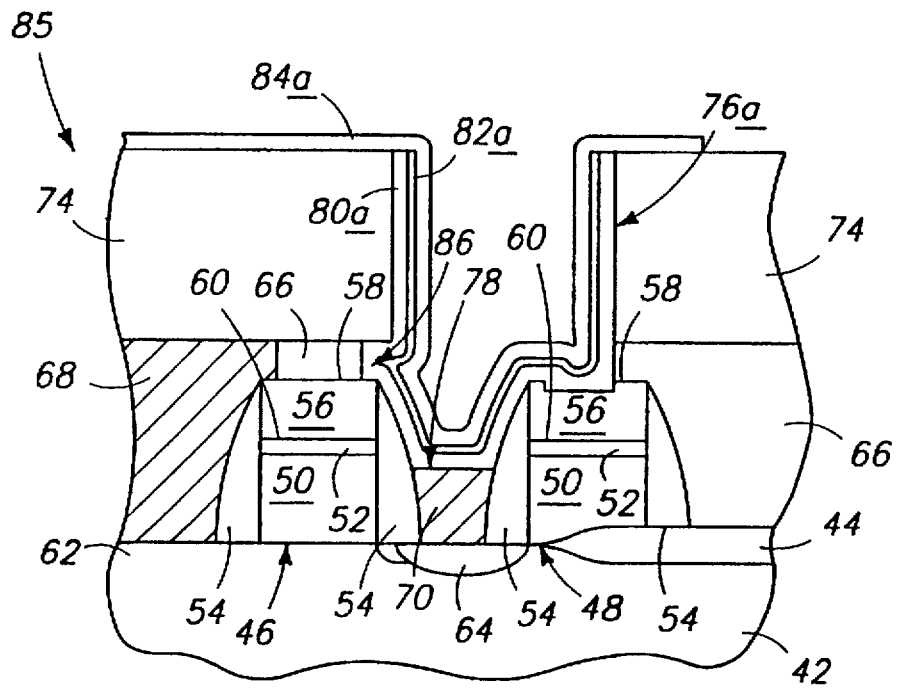
_F I G 9_
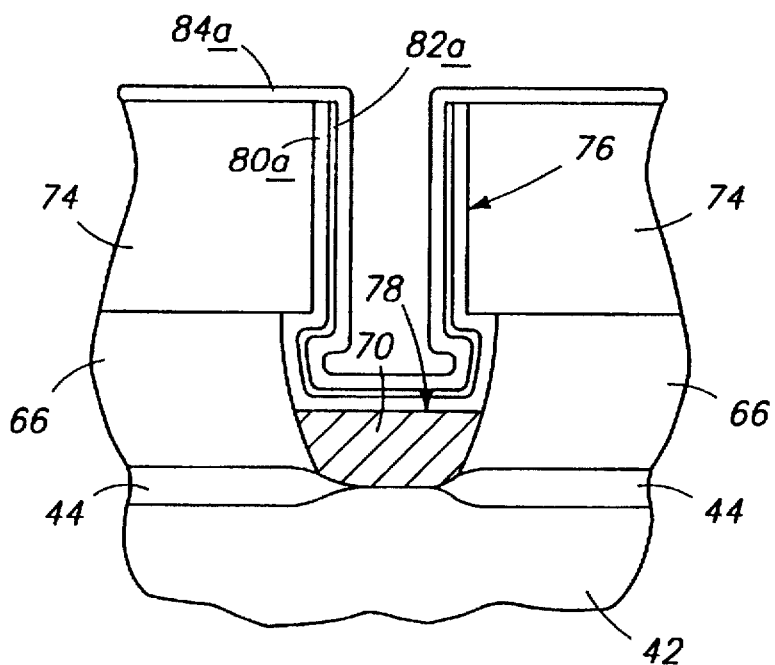
_F I G 10_

METHOD OF FORMING A CAPACITOR

RELATED PATENT DATA

The present application is a continuation application of application Ser. No. 08/440,212 which was filed on May 12, 1995, now U.S. Pat. No. 5,604,147.

TECHNICAL FIELD

This invention relates to methods of forming capacitors and to capacitor constructions.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area.

A principal way of increasing cell capacitance is through cell structure techniques. Such techniques include three-dimensional cell capacitors, such as trenched or stacked capacitors. This invention concerns stacked capacitor cell constructions, including what are commonly known as crown or cylindrical container stacked capacitors.

Many circuit designs require that capacitors make electrical connection with diffusion regions in bulk semiconductor (typically silicon) substrates. Some process flows for fabricating such circuits enable minimizing the spacing between adjacent devices by utilizing electrically conductive polysilicon plugs which project outwardly relative to the desired diffusion regions. Container capacitor constructions are then fabricated outwardly of the polysilicon plugs, with the electrically conductive storage nodes making ohmic electrical connection with the polysilicon plugs.

One such prior art construction is indicated generally in FIG. 1 with the numeral 10. Such comprises a bulk substrate 12, field oxide region 14 and a pair of word line construction 16, 18. A pair of diffusion regions 20 and 22 are provided adjacent word line 16. An insulating layer 24 is provided outwardly of word lines 16 and 18, and is provided with a pair of electrically conductive pillars or plugs 26 extending therethrough to the respective diffusion regions 20 and 22. An overlying layer 28 of borophosphosilicate glass (BPSG) is deposited, and includes a container opening 30 therethrough to conductive plug 26. A capacitor construction 32, including a storage node layer 34, a capacitor dielectric layer 36, and a cell polysilicon layer 38 are provided.

It would be desirable to improve upon such prior art capacitor constructions to result in increase capacitance.

BRIEF DESCRIPTION OF THE DRAWINGS

Preferred embodiments of the invention are described below with reference to the following accompanying drawings.

FIG. 1 is diagrammatic cross-sectional view of a prior art semiconductor wafer fragment, and is discussed in the "Background" section above.

FIG. 2 is a diagrammatic cross-sectional view of a semiconductor wafer fragment at one processing step in accordance with the invention.

FIG. 3 is a view of the FIG. 2 wafer fragment at a processing step subsequent to that shown by FIG. 2.

FIG. 4 is a top view of FIG. 3.

FIG. 5 is a view of the FIG. 2 wafer fragment at a processing step subsequent to that shown by FIG. 3.

FIG. 6 is a view of the FIG. 2 wafer fragment at a processing step subsequent to that shown by FIG. 5.

FIG. 9 is a view of the FIG. 7 wafer fragment at a processing step subsequent to that shown by FIG. 7.

FIG. 10 is a view of the FIG. 7 wafer fragment corresponding in process sequence to FIG. 9, but taken at the same 90° as the FIG. 8 view.

DETAILED DESCRIPTION OF THE PREFERRED EMBODIMENTS

Figure 7:
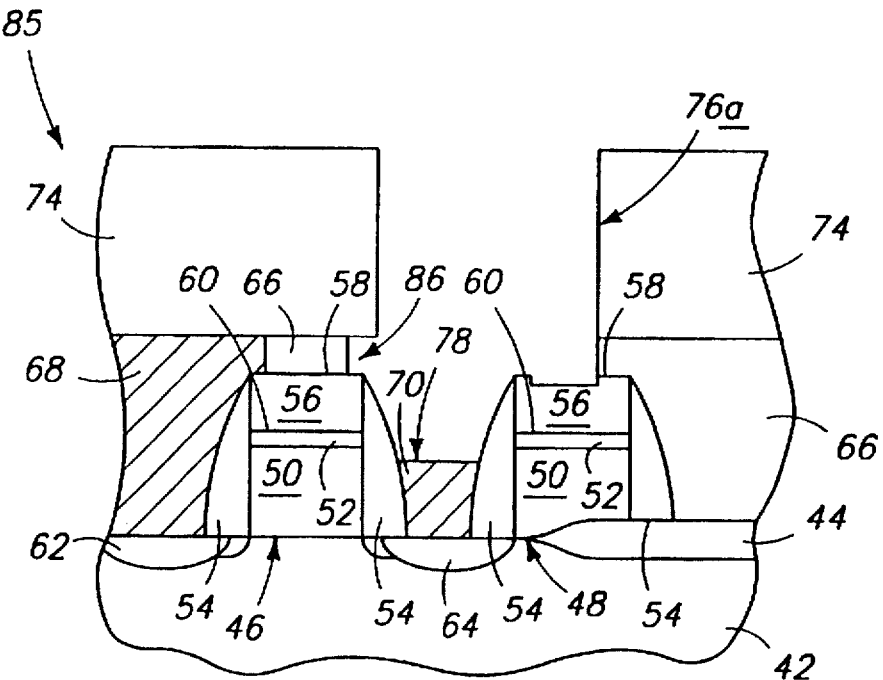
FIG. 7 is a diagrammatic cross-sectional view of an alternate embodiment wafer fragment illustrating an alternate processing step than that depicted by FIG. 5.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a stacked container capacitor comprises the following steps:

providing a node on a substrate to which electrical connection to a capacitor is to be made;

providing an electrically conductive pillar in electrical connection with the node, the pillar projecting outwardly relative to the node and having a first outer surface;

providing an insulating dielectric layer over the conductive pillar;

etching a container opening through the insulating dielectric layer to outwardly expose the conductive pillar first outer surface;

etching the exposed conductive pillar to define a pillar second outer surface which is closer to the node than the pillar first outer surface and to deepen the container opening;

providing an electrically conductive storage node container layer within the container opening over the second outer conductive pillar surface;

providing a capacitor dielectric layer over the capacitor storage node layer; and providing an electrically conductive outer capacitor plate over the capacitor dielectric layer.

In accordance with another aspect of the invention, a stacked container capacitor construction comprises:

a substrate;

an electrically conductive runner provided on the substrate, the runner having an outer conductive surface, the runner having electrically insulative sidewall spacers and an electrically insulative cap, the cap having an outer surface;

a node on the substrate adjacent the electrically conductive runner;

an electrically conductive pillar in electrical connection with the node, the pillar projecting outwardly relative to the node adjacent the conductive runner, the pillar having an outer surface;

an electrically conductive storage node container layer in electrical connection with the pillar;

a capacitor dielectric layer over the capacitor storage node layer; and an electrically conductive outer capacitor plate over the capacitor dielectric layer; and the pillar outer surface being elevationally inward of the cap outer surface.

More particularly, FIG. 2 illustrates a semiconductor wafer in process in accordance with the invention and is indicated generally with reference numeral 40. Wafer 40 comprises a bulk substrate region 42 and field oxide regions 44. A pair of spaced conductive runners 46, 48 are provided relative to substrate 42. Such comprise conductive polysilicon regions 50 and an overlying higher electrically conductive region 52 of $WSi_x$. Electrically insulative sidewall spacers 54 and a respective insulating cap 56 encapsulate and insulate exterior surfaces of conductive runners 46 and 48. An example and preferred material of construction for spacers 54 and caps 56 is $Si_3N_4$. For purposes of the continuing discussion, caps 56 include an outer surface 58, while conductive runners 46, 48 have an outermost conductive surface 60. Diffusion regions 62 and 64 are provided laterally adjacent runner 46, with diffusion region 64 constituting a node between runners 46 and 48 to which electrical connection to a capacitor is to be made.

A planarized insulating layer 66 is provided outwardly of conductive runners 46 and 48, and is provided with a pair of electrically conductive pillars 68 and 70. Layer 66 preferably comprises an oxide, such as BPSG. Pillar 68 constitutes a node for electrical connection with a bit line (not shown). Pillar 70 is in electrical connection with and projects outwardly relative to node 64 between runners 46 and 48. Pillar 70 includes a first outer surface 72 which is positioned outwardly of both runner caps 56. Pillar 70 completely fills the space between pair of runners 46 and 48 relative to its cross-sectional location. An insulating dielectric layer 74, typically BPSG, is provided outwardly of caps 56 and pillars 68, 70.

Referring to FIG. 3, a container opening 76 is etched through insulating dielectric layer 74 to outwardly expose conductive pillar first outer surface 72. Example etch conditions include utilization of a $CHF_3/CF_4/Ar$ gas mixture at 500–900 watts power and 50 mTorr–300 mTorr pressure, and 0–300 gauss magnetic field in an AME 5000 reactor.

Referring to FIGS. 4 and 5, exposed conductive pillar 70 is anisotropically etched to define a pillar second outer surface 78 which is closer to node 64 than pillar first outer surface 72, and to effectively deepen container opening 76. An example etch chemistry for producing the FIG. 5 construction includes a combination of $Cl_2$ and HBr. Example power is 100–300 watts, with a pressure of 100–300 mTorr and a magnetic field at 50–100 gauss. As is clearly apparent from FIG. 4, the cross-sectional area of the conductive pillar second outer surface 78 is considerably less than the cross-sectional area of conductive pillar first outer surface 72. Further, container opening 76 is patterned to be misaligned and overlap with the first outer surface cross-sectional area 72 of pillar 70. Also as shown, the step of etching preferably comprises removing at least 50% of the initial thickness of pillar 70 prior to the pillar etching step. Most preferably and as shown, the pillar etching step defines pillar second outer surface 78 to be elevationally inward of both runner caps 56 and outer conductive surfaces 60 of conductive runners 46 and 48.

Referring to FIG. 6, an electrically conductive storage node container layer 80 is deposited within container opening 76 over second outer conductive pillar surface 78, and preferably subsequently chemical-mechanical polished back relative to insulating dielectric layer 74. An example and preferred material is conductively doped polysilicon. Subsequently, a capacitor dielectric layer 82 is provided over capacitor storage node layer 80. A preferred material is an oxygen-nitride-oxygen composite. Subsequently, an electrically conductive outer capacitor plate 84 is provided over capacitor dielectric layer 80 to complete essential construction of a container capacitor.

The above describe embodiment provides a 20% to 30% capacitance increase over the FIG. 1 prior art construction.

FIG. 7 illustrates an alternate embodiment wafer fragment 85. Like numbers from the previously described inventive embodiment are utilized where appropriate, with differences being indicated with the suffix "a". FIG. 7 illustrates an alternate embodiment etch of the FIG. 3 construction and corresponds in process sequence to that shown by FIG. 5 of the first described embodiment. Here, the pillar etching step comprises isotropically etching pillar 70 to provide at least one lateral recess 86 relative to the container opening and insulating dielectric layers 66, 74 to effectively widen container opening 76 to a 76a shape.

Figure 8:
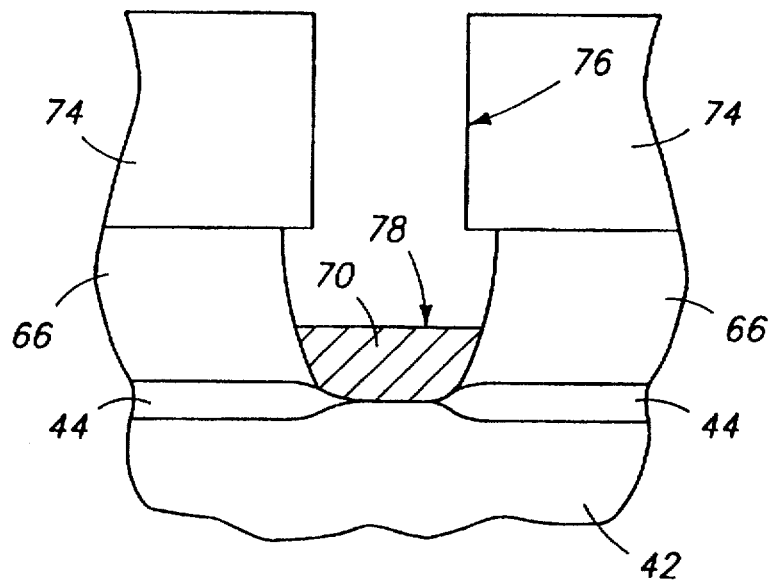
FIG. 8 is cross-sectional view of the FIG. 7 wafer taken at 90° to the FIG. 7 cut.

FIG. 8 illustrates a cut taken parallel to word lines 46 and 48 through plug 70. An example dry etch chemistry to produce the construction of FIGS. 7 and 8 would include $Cl_2$ at 200–500 watts, 100–300 mTorr, and 50–100 gauss magnetic field. A wet etch chemistry could include $NH_4OH$.

Referring to FIGS. 9 and 10, a subsequently deposited electrically conductive storage node layer 80a, capacitor dielectric layer 82a and outer capacitor plate 84a collectively fill lateral recess 86. Such recess thereby provides additional space and surface area, and correspondingly additional capacitance over the first described embodiment. For example, capacitance increase in the FIGS. 7–10 embodiment over the FIG. 1 prior art has been shown to equal approximately 30–45% more capacitance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a stacked container capacitor comprising the following steps:

providing a node on a substrate to which electrical connection to a capacitor is to be made;

providing an electrically conductive pillar in electrical connection with the node, the pillar projecting outwardly relative to the node and having a first outer surface;

providing an insulating dielectric layer over the conductive pillar;

etching a container opening through the insulating dielectric layer to outwardly expose only a portion of the conductive pillar first outer surface;

etching the exposed portion of the conductive pillar to define a pillar second outer surface which is closer to the node than the pillar first outer surface and to deepen the container opening;

providing an electrically conductive storage node container layer within the container opening over the second outer conductive pillar surface;

providing a capacitor dielectric layer over the capacitor storage node layer; and providing an electrically conductive outer capacitor plate over the capacitor dielectric layer.

2. The semiconductor processing method of forming a stacked container capacitor of claim 1 wherein the conductive pillar first outer surface has a first cross-sectional area and the conductive pillar second outer surface has a second cross-sectional area, the second cross-sectional area being less than the first cross-sectional area.

3. The semiconductor processing method of forming a stacked container capacitor of claim 1 wherein the conductive pillar first outer surface has a first cross-sectional area and the container opening has a cross-sectional area relative to the insulating dielectric layer, the first cross-sectional area being misaligned and overlapping with the container opening cross-sectional area, the pillar etching step comprising an anisotropic etch.

4. The semiconductor processing method of forming a stacked container capacitor of claim 1 wherein the conductive pillar first outer surface has a first cross-sectional area and the container opening has a cross-sectional area relative to the insulating dielectric layer, the first cross-sectional area being misaligned and overlapping with the container opening cross-sectional area, the pillar etching step comprising isotopically etching the pillar to provide at least one lateral recess relative to the container opening; the electrically conductive storage node layer, the capacitor dielectric layer and the outer capacitor plate collectively filling the lateral recess.

5. The semiconductor processing method of forming a stacked container capacitor of claim 1 wherein the conductive pillar comprises an initial thickness prior to etching and the step of etching the conductive pillar comprises removing at least 50% of the initial thickness of the pillar.

6. The semiconductor processing method of forming a stacked container capacitor of claim 1 wherein the conductive pillar comprises conductively doped polysilicon.

7. A semiconductor processing method of forming a stacked container capacitor comprising the following steps:
 providing a pair of spaced conductive runners relative to a substrate;
 providing a node between the runners to which electrical connection to a capacitor is to be made;
 providing an electrically conductive pillar in electrical connection with the node, the pillar projecting outwardly relative to the node between the runners and having a first outer surface positioned outwardly of the pair of runners, the pillar completely filling the space between the pair of runners at the location where the pillar is located;
 providing an insulating dielectric layer over the pair of spaced conductive runners and the conductive pillar;
 etching a container opening through the insulating dielectric layer to outwardly expose only a portion of the conductive pillar first outer surface;
 etching the exposed conductive portion of the conductive pillar to define a pillar second outer surface which is closer to the node than the pillar first outer surface and to deepen the container opening;
 providing an electrically conductive storage node container layer within the container opening over the second outer conductive pillar surface;
 providing a capacitor dielectric layer over the capacitor storage node layer; and
 providing an electrically conductive outer capacitor plate over the capacitor dielectric layer.

8. The semiconductor processing method of forming a stacked container capacitor of claim 7 wherein the conductive pillar first outer surface has a first cross-sectional area and the conductive pillar second outer surface has a second cross-sectional area, the second cross-sectional area being less than the first cross-sectional area.

9. The semiconductor processing method of forming a stacked container capacitor of claim 7 wherein the conductive pillar first outer surface has a first cross-sectional area and the container opening has a cross-sectional area relative to the insulating dielectric layer, the first cross-sectional area being misaligned and overlapping with the container opening cross-sectional area, the pillar etching step comprising an anisotropic etch.

10. The semiconductor processing method of forming a stacked container capacitor of claim 7 wherein the conductive pillar first outer surface has a first cross-sectional area and the container opening has a cross-sectional area relative to the insulating dielectric layer, the first cross-sectional area being misaligned and overlapping with the container opening cross-sectional area, the pillar etching step comprising isotopically etching the pillar to provide at least one lateral recess relative to the container opening; the electrically conductive storage node layer, the capacitor dielectric layer and the outer capacitor plate collectively filling the lateral recess.

11. The semiconductor processing method of forming a stacked container capacitor of claim 7 wherein the conductive pillar comprises an initial thickness prior to etching and the step of etching the conductive pillar comprises removing at least 50% of the initial thickness of the pillar.

12. The semiconductor processing method of forming a stacked container capacitor of claim 7 wherein the conductive pillar comprises conductively doped polysilicon.

13. A semiconductor processing method of forming a stacked container capacitor comprising the following steps:
 providing a pair of spaced conductive runners relative to a substrate, the conductive runners respectively having electrically insulative sidewall spacers and an electrically insulative cap, the caps having respective outer surfaces;
 providing a node between the runners to which electrical connection to a capacitor is to be made;
 providing an electrically conductive pillar in electrical connection with the node, the pillar projecting outwardly relative to the node between the runners and having a first outer surface positioned outwardly of both runner caps, the pillar completely filling the space between the pair of runners at the location where the pillar is located;
 providing an insulating dielectric layer outwardly of the caps and the conductive pillar;
 etching a container opening through the insulating dielectric layer to outwardly expose only a portion of the conductive pillar first outer surface;
 etching the exposed portion of the conductive pillar to define a pillar second outer surface which is closer to the node than the pillar first outer surface and to deepen the container opening;
 providing an electrically conductive storage node container layer within the container opening over the second outer conductive pillar surface;
 providing a capacitor dielectric layer over the capacitor storage node layer; and
 providing an electrically conductive outer capacitor plate over the capacitor dielectric layer.

14. The semiconductor processing method of forming a stacked container capacitor of claim 13 wherein the conductive pillar first outer surface has a first cross-sectional area and the conductive pillar second outer surface has a second cross-sectional area, the second cross-sectional area being less than the first cross-sectional area.

15. The semiconductor processing method of forming a stacked container capacitor of claim 13 wherein the conductive pillar first outer surface has a first cross-sectional area and the container opening has a cross-sectional area relative to the insulating dielectric layer, the first cross-sectional area being misaligned and overlapping with the container opening cross-sectional area, the pillar etching step comprising an anisotropic etch.

16. The semiconductor processing method of forming a stacked container capacitor of claim 13 wherein the conductive pillar first outer surface has a first cross-sectional area and the container opening has a cross-sectional area relative to the insulating dielectric layer, the first cross-sectional area being misaligned and overlapping with the container opening cross-sectional area, the pillar etching step comprising isotopically etching the pillar to provide at least one lateral recess relative to the container opening; the electrically conductive storage node layer, the capacitor dielectric layer and the outer capacitor plate collectively filling the lateral recess.

17. The semiconductor processing method of forming a stacked container capacitor of claim 13 wherein the conductive pillar comprises an initial thickness prior to etching and the step of etching the conductive pillar comprises removing at least 50% of the initial thickness of the pillar.

18. The semiconductor processing method of forming a stacked container capacitor of claim 13 wherein the conductive pillar comprises conductively doped polysilicon.

19. The semiconductor processing method of forming a stacked container capacitor of claim 13 wherein the pillar etching step defines the pillar second outer surface to be elevationally inward of both runner caps.

20. The semiconductor processing method of forming a stacked container capacitor of claim 13 wherein the conductive runners have outer conductive surfaces, the pillar etching step defining the pillar second outer surface to be elevationally inward of both runner outer conductive surfaces.

21. A semiconductor processing method of forming a capacitor, comprising the following steps:

forming an electrically conductive pillar over a substrate, the pillar having an outer surface;

forming an insulating dielectric layer over the conductive pillar;

removing a portion of the insulating dielectric layer to form an opening through the insulating dielectric layer and down to at least the conductive pillar outer surface;

removing a portion of the conductive pillar;

forming a storage node layer within the opening;

forming a capacitor dielectric layer over the capacitor storage node layer; and forming an outer capacitor plate over the capacitor dielectric layer.

22. The method of claim 21 wherein the steps occur sequentially as written.

23. A semiconductor processing method of forming a capacitor, comprising the following steps:

forming an electrically conductive pillar supported by a substrate and having a first outer surface;

forming an insulating dielectric layer over the conductive pillar;

removing a portion of the insulating dielectric layer to form an opening in the insulating dielectric layer and to expose the conductive pillar first outer surface within the opening;

removing a portion of the exposed conductive pillar to define a conductive pillar second outer surface which is closer to the substrate than the conductive pillar first outer surface;

forming a storage node layer within the opening;

forming a capacitor dielectric layer over the capacitor storage node layer; and forming an outer capacitor plate over the capacitor dielectric layer.

* * * * *